(12) United States Patent
Cunningham et al.

(10) Patent No.: US 6,258,616 B1
(45) Date of Patent: Jul. 10, 2001

(54) METHOD OF MAKING A SEMICONDUCTOR DEVICE HAVING A NON-ALLOYED OHMIC CONTACT TO A BURIED DOPED LAYER

(75) Inventors: John Edward Cunningham, Lincroft; Keith Wayne Goossen, Aberdeen, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/083,165

(22) Filed: May 22, 1998

(51) Int. Cl.[7] .................................................. H01L 21/00
(52) U.S. Cl. ........................ 438/37; 438/48; 438/98; 438/233
(58) Field of Search ............................. 438/37, 98, 233, 438/48

(56) References Cited

U.S. PATENT DOCUMENTS

| | | | |
|---|---|---|---|
| 4,772,934 | * 9/1988 | Cunningham et al. ............. | 357/65 |
| 4,784,967 | * 11/1988 | Cunningham et al. ............. | 437/40 |
| 4,789,645 | * 12/1988 | Calviello et al. ..................... | 437/51 |
| 4,794,445 | * 12/1988 | Homma et al. ...................... | 357/71 |
| 4,882,609 | * 11/1989 | Schubert et al. .................... | 357/22 |
| 5,004,705 | * 4/1991 | Blackstone .......................... | 437/225 |
| 5,013,685 | 5/1991 | Chiu et al. . | |
| 5,700,349 | * 12/1997 | Tsukamoto et al. ................. | 156/657 |
| 5,856,700 | * 1/1999 | Woodbury ........................... | 257/518 |
| 5,895,953 | * 4/1999 | Beasom .............................. | 257/751 |
| 5,932,898 | * 8/1999 | Dikeman et al. ................... | 257/173 |

* cited by examiner

Primary Examiner—Matthew Smith
Assistant Examiner—Granvill D Lee
(74) Attorney, Agent, or Firm—Mathews, Collins, Shepherd, Gould, P.A.

(57) ABSTRACT

A semiconductor device having a buried doped layer of semiconductor material and a non-alloyed contact to the buried doped layer. The non-alloyed contact is made ohmic by the presence of an underlying delta-doped monolayer. The semiconductor device is made by placing a stop-etch layer on top of a buried doped layer and forming at least one delta-doped monolayer in either the stop-etch layer or the buried doped layer. Layers of semiconductor material disposed above the stop-etch layer are removed with an etchant to define an active region of the semiconductor device. The stop-etch layer prevents the etchant from removing the delta-doped monolayer. A non-alloyed metal film is then deposited over the delta-doped monolayer to form an ohmic contact to the buried doped layer.

19 Claims, 6 Drawing Sheets

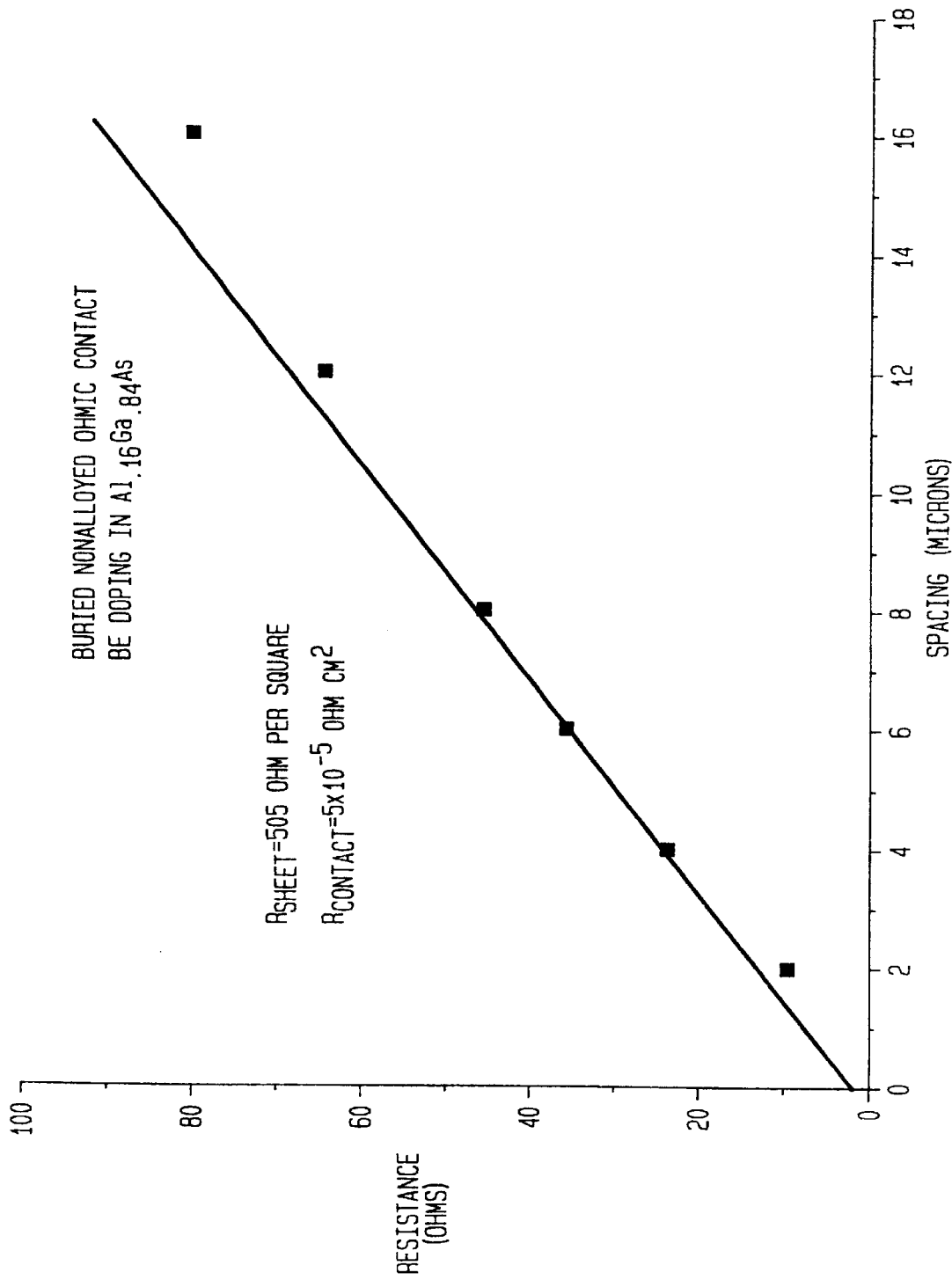

METHOD OF MAKING A SEMICONDUCTOR DEVICE HAVING A NON-ALLOYED OHMIC CONTACT TO A BURIED DOPED LAYER

FIELD OF THE INVENTION

This invention relates to semiconductor devices, and in particular, to a semiconductor device having a non-alloyed ohmic contact to a buried doped semiconductor layer. It also relates to a method for making such devices.

BACKGROUND OF THE INVENTION

Semiconductor devices are used in a vast assortment of equipment including computers and communication systems. Many of these semiconductor devices have multilayered structures that include semiconductive layers of dissimilar doping. Separate ohmic contacts are frequently made to the different layers of the device.

It is often desirable that the ohmic contacts of the device be produced without subsequent heating. Such ohmic contacts are referred to as being "non-alloyed". Methods for producing non-alloyed ohmic contacts to doped semiconductor surface layers are well known in the art. See, U.S. Pat. No. 5,013,685 to Chiu et al. which is incorporated herein by reference. They are used in semiconductor devices which are susceptible to damage caused by heat.

Photonic semiconductor devices such as vertical-cavity surface emitting lasers and modulators are particularly susceptible to heating during subsequent semiconductor processing. These devices employ highly reflective mirrors made from gold films or silver capped gold films which form laser cavities or produce reflective modulation. These gold and silver films are most effective when applied directly to the surfaces of pristine semiconductor layers (semiconductor surfaces that have not been subjected to heating) without using base layers of chromium or titanium. When used without the base layers, the gold and silver films can buckle when heated. Buckling of these films reduces their reflectivity and leads to reliability problems.

This heat susceptibility presents major obstacles in the fabrication of photonic semiconductor devices. It is desirable to apply the mirrors early in the fabrication process so that they can be used as masks in self-aligned processing steps. But ohmic contacts must be formed at the end and typically at least one ohmic contact must be made to a buried doped semiconductor layer.

Unfortunately, there are no known processes for fabricating non-alloyed ohmic contacts to buried doped semiconductor layers of semiconductor devices. Since buried alloyed contacts are typically fabricated at about 420° C., buckling of the gold or silver mirror films frequently occurs when the second ohmic contacts are fabricated.

Accordingly, a need exists for a method of producing a non-alloyed contact to a buried doped layer of a semiconductor device.

SUMMARY

An improved semiconductor device comprises a buried doped layer of semiconductor material and a non-alloyed contact to the buried doped layer. The non-alloyed contact is made ohmic by the presence of an underlying delta-doped monolayer. The semiconductor device is made by placing a stop-etch layer on top of a buried doped layer and forming at least one delta-doped monolayer in either the stop-etch layer or the buried doped layer. Layers of semiconductor material disposed above the stop-etch layer are removed with an etchant to define an active region of the semiconductor device. The stop-etch layer prevents the etchant from removing the delta-doped monolayer. A non-alloyed metal film is then deposited over the delta-doped monolayer to form an ohmic contact to the buried doped layer.

BRIEF DESCRIPTION OF THE DRAWINGS

The advantages nature and various additional features of the invention will appear more fully upon consideration of the illustrative embodiments now to be described in detail in connection with the accompanying drawings wherein:

FIG. 2 is a transmission line measurement of the resistance in ohms vs. contact spacing in microns on the semiconductor-metal interface to a buried non-alloyed ohmic contact using a Be delta-doped $Al_{0.16}Ga_{0.84}As$ monolayer;

It is to be understood that these drawings are for purposes of illustrating the concepts of the invention and, except for graphical illustrations, are not the scale.

DETAILED DESCRIPTION OF THE INVENTION

Figure 1:
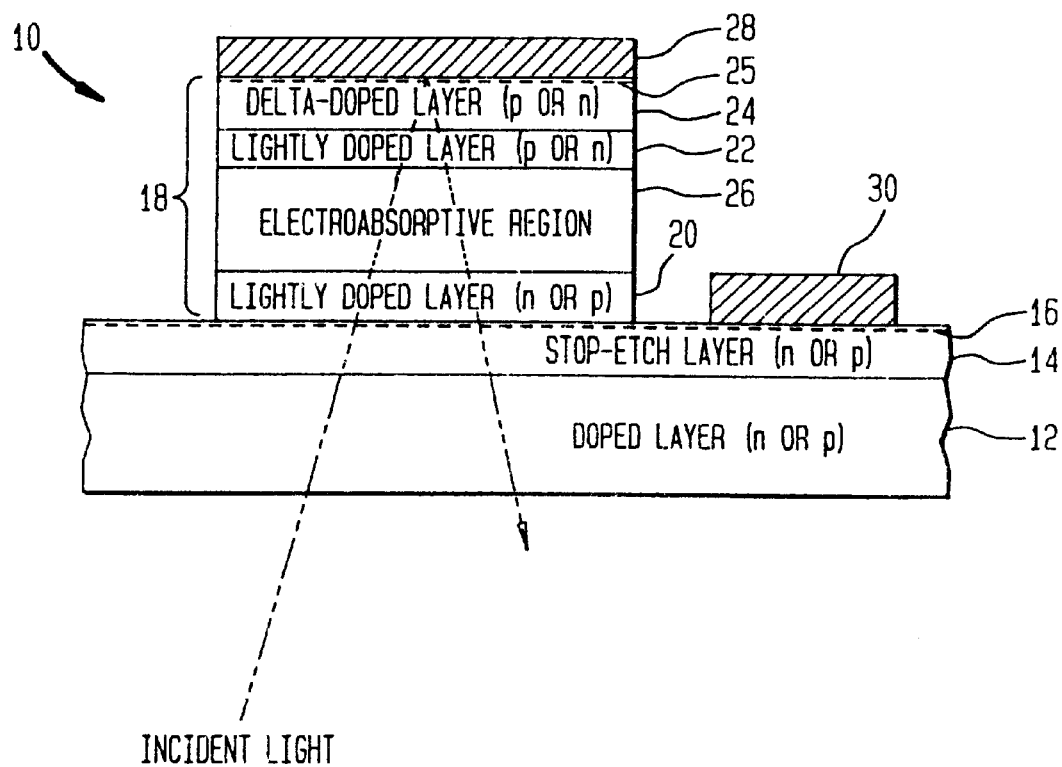
FIG. 1 is a cross-sectional view through a semiconductor device having a non-alloyed ohmic contact to a buried doped semiconductor layer.

FIG. 1 shows a multilayer semiconductor device 10 having a non-alloyed ohmic contact to a buried doped semiconductor layer. For illustrative purposes, the semiconductor device 10 comprises a modulator based on III–V semiconductor material such as AlGaAs. The modulator 10 includes a buried doped layer 12 of n or p AlGaAs followed by a chemically selective delta-doped stop-etch layer 14. The delta-doped stop-etch layer is composed of a layer of n or p semiconductor material such as InGaP and a delta-doped monolayer or dopant sheet 16 disposed about 25 Å below the stop-etch layer's 14 surface. The monolayer 16 can be comprised of a dopant such as Be. This type of doping provides an increased amount of dopant in a single atomic plane or monolayer of the crystal. A plurality of AlGaAs layers formed in a mesa structure 18 are disposed over a portion of the delta-doped stop-etch layer 14. The layers consist of a lightly doped n or p layer 20, a lightly doped p or n layer 22 and a delta-doped p or n layer 24 having a second delta-doped Be monolayer 25 disposed about 25 Å below the layer's 24 surface. The lightly doped layers 20, 22 define an electroabsorptive region 26 therebetween. A mirror 28 formed by Au or Au capped Ag film (about 200 nm to about 1000 nm thick) is disposed on the delta-doped layer 24. The mirror 28 in the presence of the underlying delta-doped monolayer 25 forms a self-aligned non-alloyed ohmic contact. A buried contact 30 formed by a second non-alloyed metal film is disposed on the delta-doped stop-etch layer 14 to provide contact to the buried doped layer 12. The buried non-alloyed contact 30 is also ohmic because of the presence of the delta-doped monolayer 16 just under the surface of the delta-doped stop-etch layer 14. The metal film of the buried contact 30 is about 200 nm to about 1000 nm thick and can be formed from Ti, Au, Ag, Pt or combinations well known to those skilled in the art.

When a delta-doped monolayer is placed at a distance $z_D$ from the metal-to-semiconductor interface (see U.S. Pat. No. 5,013,685 to Chiu et al), the tunneling barrier t is thin ($t \leq z_D$) and hence, quantum-mechanical tunneling through the barrier provides the dominant transport mechanism. The minimized tunneling distance, therefore, advantageously lowers the contact resistance. The delta-doped monolayer creates a reservoir of electrons at a distance t from the metal-to-semiconductor interface. A major fraction of these electrons which originate from donors of the delta-doped monolayer occupy surface states at the metal-semiconductor interface.

Using the delta-doped monolayers 16, 25 underneath the metal films 28, 30 advantageously results in lower resistance contacts which do not require alloying. This substantially reduces the amount of heat the device is subjected to during semiconductor processing thus, maintaining the reflectivity and reliability of the mirror 28.

To further insure a low contact resistance, additional delta-doped layers can be provided under each metal film. Additional delta-doped layers provided under the metal mirror film 28 can each include a p or n layer of AlGaAs and a delta-doped monolayer of Be. Additional delta-doped layers provided under the buried contact film 30 can each include a p or n layer of AlGaAs (disposed under the delta-doped stop-etch layer 14) and a delta-doped monolayer of Be.

FIG. 2 is a transmission line measurement (TLM) that demonstrates the buried non-alloyed ohmic contact of the present invention using Be doping in $Al_{0.16}Ga_{0.84}As$. This measurement was accomplished by forming the semiconductor structure shown in FIG. 1 by etching down to the stop-etch layer 14 to expose its surface. Next, a TLM structure consisting of a line of variably spaced metal pads were photolithography formed by deposition of Au onto the surface of the stop-etch layer 14 followed by lift-off. Each metal pad was similar to the pad 30 shown in FIG. 1. Such TLM structures are well known in the semiconductor art for performing TLM measurements. At this stage, the TLM structure would be alloyed by heating if the conventional alloyed ohmic contacts are desired to be measured. However, in the present invention, the TLM structure does not need to be alloyed (hence, the metal mirror film on the mesa structure is not degraded by heat). FIG. 2 shows the resistance measurement obtained on the non-alloyed TLM structure. The ohmic contact exhibited a sheet resistance $R_{SHEET}$ of 505 ohm per square and a contact resistance of $R_{CONTACT}$ of $5 \times 10^{-5}$ ohm $cm^2$. This very low contact resistance contributes minimally to the overall resistance of the semiconductor device.

Figure 3A:
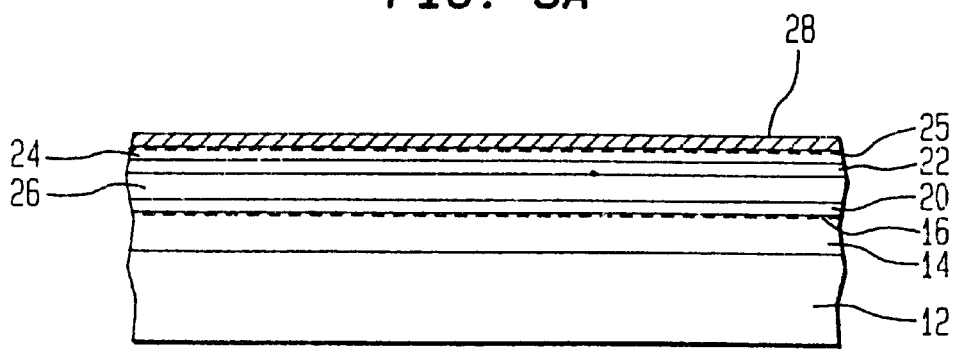
FIGS. 3A–3C are cross-sectional views illustrating a method for making the semiconductor device of FIG. 1.
Figure 3B:
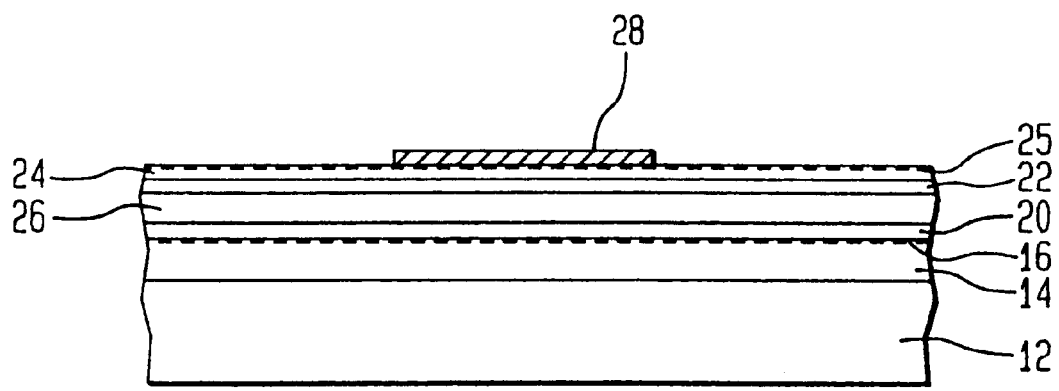
Figure 3C:
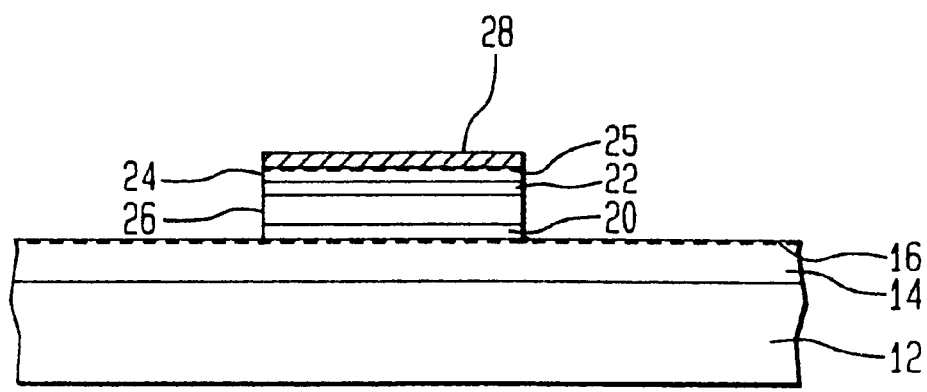

FIGS. 3A–3C illustrate a method for fabricating the modulator device 10 shown in FIG. 1. The first step shown in FIG. 3A, includes forming the delta-doped stop etch layer 14 over the buried doped layer 12. Methods for producing delta-doped layers in III–V semiconductor materials are well known in the art. One such method is described in U.S. Pat. No. 5,013,685 to Chiu et al.

The lightly doped layers 20, 22 and the delta-doped layer 24 are sequentially formed over the delta-doped stop-etch layer 14 and the device is then cooled to about room temperature. The non-alloyed mirror metal film 28 of Au or Au capped Ag is then deposited directly on the cooled surface of the delta-doped layer 24. This is performed even though the surface of the uppermost delta-doped layer 24 is exposed to atmosphere. However, measures are taken to minimize the presence of substantial oxide at the semiconductor-metal interface.

The next step shown in FIG. 3B, includes patterning the mirror film 28 into an etch mask. This can be accomplished using photolithography.

The step shown in FIG. 3C, includes etching the unmasked portions of the layers above the buried doped layer. The stop-etch layer stops the etching process approximately 25 Å from the top of the delta-doped monolayer.

The final step includes cooling the device to about room temperature and selectively depositing the second non-alloyed metal film on the cooled surface of the stop-etch layer 14 to form the non-alloyed ohmic contact 30 to the buried doped layer as shown in FIG. 1. This step is also performed so as to minimize the presence of substantial oxide at the semiconductor-metal interface. Because the metal film of the buried contact 30 does not need to be alloyed by heating the device, the reflectivity and reliability of the earlier formed mirror film 28 is maintained.

All the semiconductor layers formed in the above steps can be deposited using molecular beam epitaxy (MBE). The metal films can also be deposited using MBE.

Figure 4:
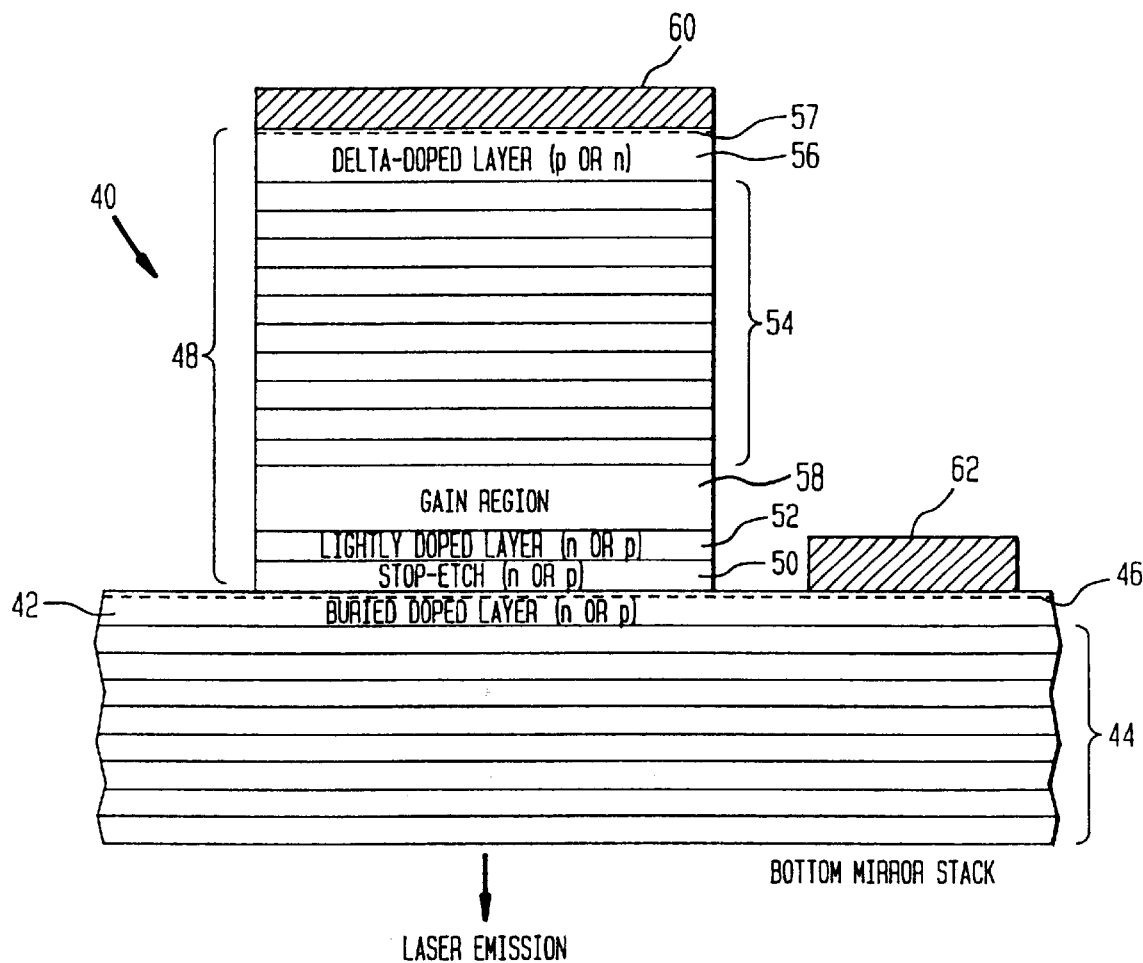
FIG. 4 is a cross-sectional view through a second type of semiconductor device having a non-alloyed ohmic contact to a buried doped semiconductor layer.

Other types of multilayer semiconductor devices can be constructed with a non-alloyed ohmic contact to a buried doped semiconductor layer. FIG. 4 shows a multilayer laser semiconductor device 40 based on III–V AlGaAs semiconductor material. The laser 40 includes a buried delta-doped layer 42 of n or p AlGaAs disposed on a plurality of semiconducting layers which form a bottom mirror stack 44. The buried doped layer 42 includes a delta-doped monolayer 46 disposed about 25 Å below the buried doped layer's 42 surface. A plurality of semiconductor layers 48 formed in a mesa structure are disposed over a portion of the buried delta-doped layer 42. The layers 48 consist of a chemically selective n or p stop-etch layer 50 such as InGaP, a lightly doped AlGaAs n or p layer 52, a plurality of AlGaAs p or n layers 54 which form an upper mirror stack, and a delta-doped AlGaAs p or n monolayer 56. The lightly doped n or p layer 52 and the upper mirror stack 54 define a gain region 58. A mirror 60 formed by Au or Au capped Ag film (about 200 nm to about 1000 nm thick) is disposed on the delta-doped layer 56. The presence of a delta-doped monolayer 57 under the metal mirror film 60 provides a self-aligned non-alloyed ohmic contact. A buried contact 62 formed by a second non-alloyed metal film such as Ti, Au, Ag, or Pt, is disposed on the buried delta-doped layer 42. The contact 62 is about 200 nm to about 1000 nm thick and is also ohmic because of the presence of the delta-doped monolayer 46.

FIGS. 5A–5E illustrate a method for fabricating the laser device 40 shown in FIG. 4. Starting with the bottom mirror stack 44, the first step shown in FIG. 5A, includes forming the buried delta-doped layer 42 the delta-doped monolayer 46 about 25 Å below the layer's surface.

Figure 5A:
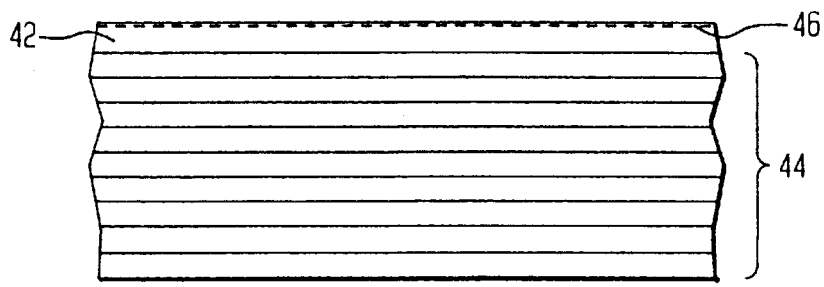
FIGS. 5A–5E are cross-sectional views illustrating a method for making the semiconductor device of FIG. 4.
Figure 5B:
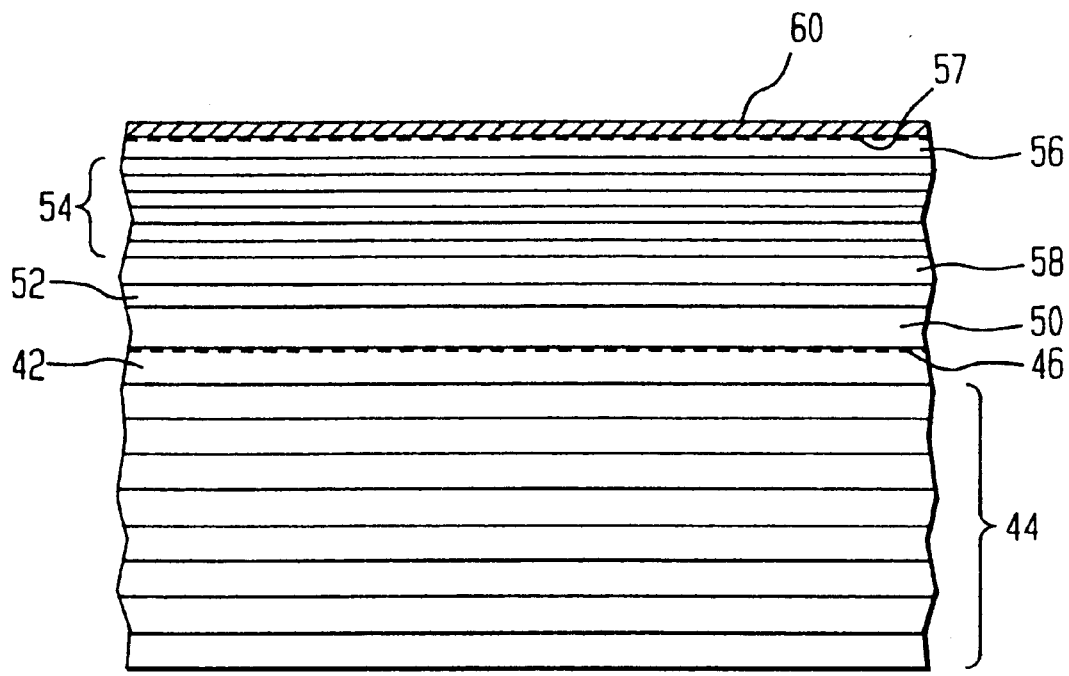

The next step shown in FIG. 5B, includes depositing the stop-etch layer 50 on top of the buried delta-doped layer 42. The lightly doped layer 52, the layers of upper mirror stack 54, and the delta-doped layer 56 are sequentially formed over the stop etch layer 50 and the device is then cooled to about room temperature. The non-alloyed metal mirror film 60 is deposited directly on the cooled surface of the delta-doped layer 56. This is performed even though the surface of the delta-doped layer 56 is exposed to atmosphere. However, measures are taken to minimize the presence of substantial oxide at the semiconductor-metal interface.

Figure 5C:
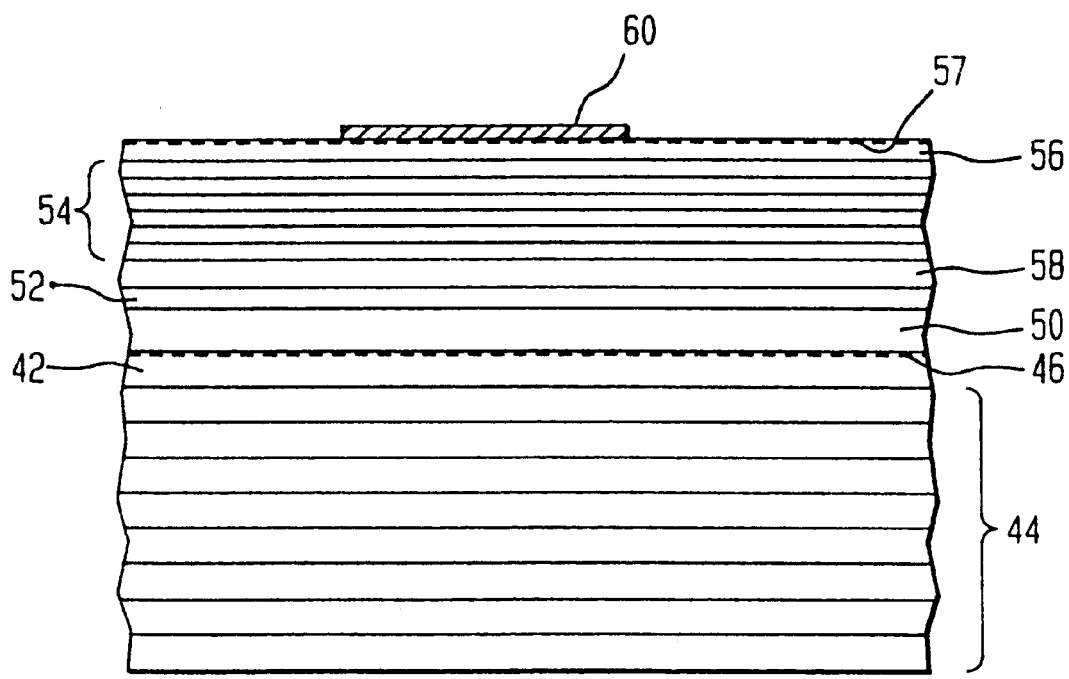

The step shown in FIG. 5C, includes patterning the mirror film 60 into an etch mask using photolithography.

Figure 5D:
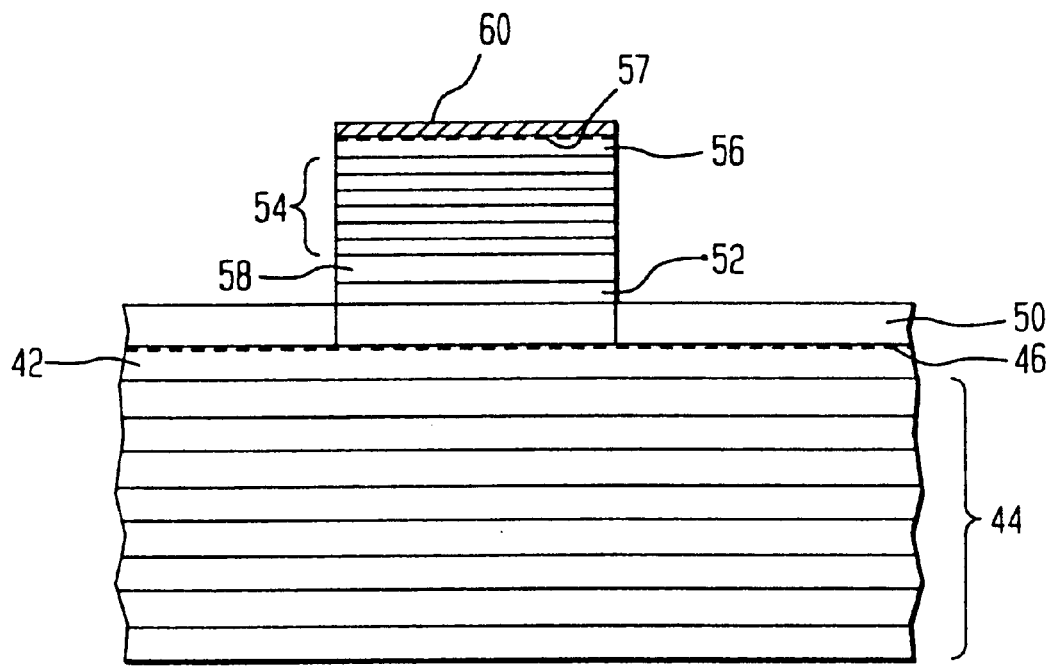
Figure 5E:
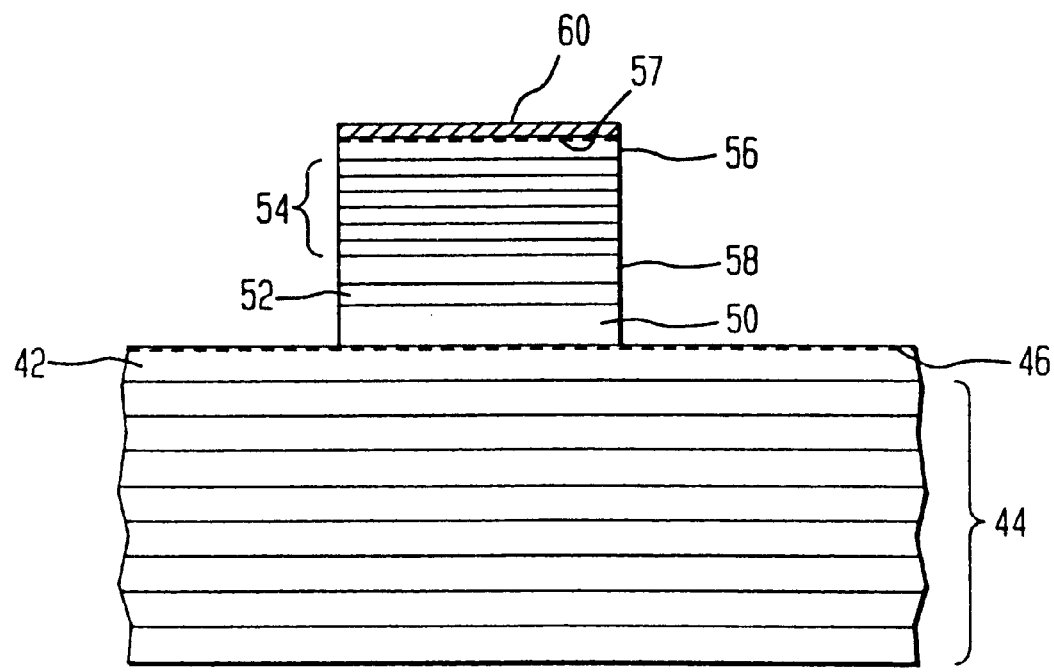

The step shown in FIGS. 5D and 5E, includes etching the unmasked layers above the buried doped layer 42. This is performed with two etching steps. The first etching step shown in FIG. 5D, is controlled by the stop-etch layer 50 and results in the removal of all the unmasked layers above the stop-etch layer 50. The second etching step shown in FIG. 5E, selectively removes the unmasked portion of the stop-etch layer 50 thereby leaving the delta-doped monolayer 46 about 25 Å below the surface of the buried doped layer 42.

The final step includes cooling the device to about room temperature and epitaxially depositing the second non-alloyed metal film on the cooled surface of the buried doped layer 42 to form the non-alloyed ohmic contact 62 to the buried doped layer 42 as shown in FIG. 4. This step is also performed so to minimize the presence of substantial oxide at the semiconductor-metal interface.

While the foregoing invention has been described with reference to the above embodiments, various modifications and changes can be made without departing from the spirit of the present invention. For example, other types of semiconductor devices such as heterojunction devices can be fabricated with a non-alloyed contact to a buried layer using the methods described herein. Moreover, the semiconductor devices can be based on other III–V semiconductor materials such as GaAs, InAsInP, InGaAsP, InAlGaAs, GaSb, or InSb. Accordingly, modifications and changes such as those suggested above but not limited thereto are considered to be within the scope of the claims.

What is claimed is:

1. A method for making a semiconductor device having a buried doped layer of semiconductor material and a non-alloyed ohmic contact to the buried doped layer, the method comprising the steps of:

forming a doped layer of semiconductor material of a given thickness;

forming at least one delta-doped monolayer over at least a portion of the given thickness of the doped layer of the semiconductor device;

placing a chemically selective stop-etch layer of semiconductor material on the doped layer;

forming at least one layer of semiconductor material on the stop-etch layer to provide a multilayer structure, the doped layer forming a buried doped layer of the multilayer structure;

removing a portion of the multilayer structure with an etchant to define an active region of the semiconductor device, the stop-etch layer preventing the etchant from removing the delta-doped monolayer; and depositing a non-alloyed metal film over the delta-doped monolayer, the non-alloyed metal film forming an ohmic contact to the buried doped layer.

2. The method according to claim 1, further comprising the step of cooling the multilayer structure to about room temperature prior to performing the metal film depositing step.

3. The method according to claim 1, further comprising the step of selectively removing the stop-etch layer prior to performing the metal film depositing step.

4. The method according to claim 3, wherein the delta-doped forming step includes forming the delta-doped monolayer in the doped layer.

5. The method according to claim 4, wherein non-alloyed metal film depositing step includes depositing the non-alloyed metal film on the buried doped layer.

6. The method according to claim 1, wherein the delta-doped forming step includes forming the delta-doped monolayer in the doped layer.

7. The method according to claim 1, wherein non-alloyed metal film depositing step includes depositing the non-alloyed metal film on the buried doped layer.

8. The method according to claim 1, wherein the delta-doped forming step includes forming the delta-doped monolayer in the stop-etch layer.

9. The method according to claim 8, wherein non-alloyed metal film depositing step includes depositing the non-alloyed metal film on the stop-etch layer.

10. The method according to claim 1, wherein non-alloyed metal film depositing step includes depositing the non-alloyed metal film on the stop-etch layer.

11. The method according to claim 1, wherein the semiconductor device comprises a modulator.

12. The method according to claim 1, wherein the semiconductor device comprises a laser.

13. The method according to claim 1, wherein the semiconductor material comprises a III–V semiconductor material.

14. The semiconductor device according to claim 1, wherein the semiconductor material comprises a III–V semiconductor material.

15. A semiconductor device comprising:

a buried doped layer of semiconductor material;

a stop-etch layer of semiconductor material disposed on at least a portion of the buried doped layer;

at least one delta-doped monolayer disposed in one of the buried doped layer and stop-etch layer; and a non-alloyed ohmic contact to the buried doped semiconductor layer, the contact being disposed over the delta-doped monolayer.

16. The semiconductor device according to claim 15, wherein the semiconductor device comprises a modulator.

17. The semiconductor device according to claim 15, wherein the semiconductor device comprises a laser.

18. The semiconductor device according to claim 15, wherein the delta-doped layer is disposed in the stop-etch layer.

19. The semiconductor device according to claim 15, wherein the delta-doped layer is disposed in the buried doped layer.

* * * * *